(12) United States Patent
Mah

(10) Patent No.: US 8,378,483 B2
(45) Date of Patent: Feb. 19, 2013

(54) FABRICATION PROCESS AND DEVICE OF MULTI-CHIP PACKAGE HAVING SPLICED SUBSTRATES

(75) Inventor: Hian-Hang Mah, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 97 days.

(21) Appl. No.: 13/175,317

(22) Filed: Jul. 1, 2011

(65) Prior Publication Data

US 2013/0001806 A1   Jan. 3, 2013

(51) Int. Cl.
*H01L 23/04* (2006.01)
(52) U.S. Cl. ........ 257/730; 257/684; 257/723; 257/773; 257/776; 257/786
(58) Field of Classification Search .................. 257/684, 257/723, 730, 773, 776, 786
See application file for complete search history.

(56) References Cited

U.S. PATENT DOCUMENTS 8,115,291 B2 * 2/2012 Baek et al. ............. 257/686

* cited by examiner

*Primary Examiner* — David Vu
*Assistant Examiner* — Brandon Fox
(74) *Attorney, Agent, or Firm* — Muncy, Geissler, Olds & Lowe, PLLC

(57) ABSTRACT

Disclosed are a fabrication process and a device of a multi-chip package having spliced substrates, characterized in utilizing an incomplete substrate and a substrate block with different dimensions to combine as a spliced complete substrate during the fabrication process. Two kinds of chips with different functions, including memory and controller, are disposed on the incomplete substrate and the substrate block, respectively. Then, the incomplete substrate and the substrate block are then spliced together by joining their spliced portions formed on their substrate sidewalls. Finally, an encapsulant is formed on the incomplete substrate and further formed on the substrate block. Accordingly, it is possible to integrate different functional chips into a single multi-chip package by optimizing packaging processing parameters with optimized materials.

15 Claims, 10 Drawing Sheets

US 8,378,483 B2

FABRICATION PROCESS AND DEVICE OF MULTI-CHIP PACKAGE HAVING SPLICED SUBSTRATES

FIELD OF THE INVENTION

The present invention relates to a packaging technology for semiconductor devices, and more specifically to a fabrication process and a device of a multi-chip package having spliced substrates.

BACKGROUND OF THE INVENTION

In early electronic products, integration of multiple semiconductors with the same or different functions is to individually package different semiconductor chips and then SMT on a same printed circuit board. However, this kind of integration takes up larger footprint and space on a printed circuit board and can not meet the requirements of thin, light, and small. Therefore, Multi-Chip Package (MCP) was developed to integrate a plurality of chips in a same package, especially for memory products or portable electronic products.

Chips with different functions and characterizations are successfully integrated and packaged in a conventional MCP, however, the selection of packaging materials and processes have to be compromised to reach a balance point between different chips which may not be optimized.

A cross-section of a conventional MCP device is shown in FIG. 1 and its corresponding packaging process flow in FIG. 2. The components of the MCP device of FIG. 1 are described in sequence of the packaging processes of FIG. 2. The MCP device comprises a plurality of chips with different functions such as a memory chip 130 and a controller chip 140, a substrate 110, and an encapsulant 150. A substrate 110 is provided in step 11. In a first die-bonding step 12, a memory chip 130 is disposed on the substrate 110 through heating and curing the die-attaching material disposed under the memory chip 130. In a second die-bonding step 13, a controller chip 140 is also disposed on the substrate 110 through heating and curing the die-attaching material disposed under the controller chip 140 where the substrate 110 experiences multiple heating processes. In a first wire-bonding step 14, a plurality of first bonding wires 132 are formed through wire bonding processes to electrically connect the memory chip 130 to the substrate 110. In a second wire-bonding step 15, a plurality of second bonding wires 142 are formed by wire bonding processes to electrically connect the controller chip 140 to the substrate 110. Since one ends of the first and second bonding wires 132 and 142 are all bonded on the substrate 110 so that all the wire bonding processes can be done on the same wire bonder to avoid multiple loading and unloading to achieve higher throughput with lower operation cost, therefore, the materials and the diameters of bonding wires as well as the wire bonding parameters are the same. However, if chips without bonding wires are also integrated in the MCP device, then additional heating processes would be needed such as thermal bonding processes of flip-chip assembly and reflow processes of solder balls. Then, in an encapsulating step 16, an encapsulant 150 is formed on the substrate 110 through molding processes to encapsulate the memory chip 130 and the controller chip 140. Finally, in a package-singulating step 17, the substrate 110 and the encapsulant 150 are cut through the scribe lines to form a plurality of individual MCP devices. Therefore, the processes, materials, and processing parameters of the existing packaging processes for MCP using the same substrate to carry a plurality of chips with different functions can not be optimized according to the specific functions of each individual chip. Moreover, as more chips are stacked in a conventional MCP device, the substrate would experience multiple heating processes which causes uncontrollable package warpage leading to more package processing issues.

SUMMARY OF THE INVENTION

The main purpose of the present invention is to provide a fabrication process and a device of MCP by utilizing concept of picture puzzle in spliced substrates to optimize processes, materials, and processing parameters according to specific functions of each individual chip and integrate in the same package to reduce substrate warpage during packaging processes.

The second purpose of the present invention is to provide a fabrication process and device of MCP by utilizing concept of picture puzzle in spliced substrates and molding on the spliced substrates without increasing package thickness or separation of substrates after assembly.

According to the present invention, a fabrication process of MCP device having spliced substrates is disclosed, primarily comprising the following processing steps. An incomplete substrate and a substrate block are provided, where one sidewall of the incomplete substrate has a first spliced portion and one sidewall of the substrate block has a corresponding second spliced portion, and the dimension of the incomplete substrate is larger than the one of the substrate block. At least a memory chip is disposed on the incomplete substrate. A controller chip is disposed on the substrate block. The substrate block is fitted in the incomplete substrate by connecting the second spliced portion of the substrate block with the first spliced portion of the incomplete substrate. An encapsulant is formed on the incomplete substrate and on the substrate block.

The fabrication process and device of MCP having spliced substrates according to the present invention has the following advantages and effects:
1. Through the implementation of substrates with different dimensions to carry chips with different functions along with a specific spliced method during MCP packaging processes as a technical mean, the processes, materials, and processing parameters according to specific functions of each individual chip can easily be optimized and integrated in the same package to reduce substrate warpage during packaging processes.
2. Through the connection between the spliced portions of the substrates and the formation of encapsulant on both substrates as a technical mean, the package thickness will not increase due to the implementation of the spliced substrates and the separation of substrates after assembly can be avoided.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
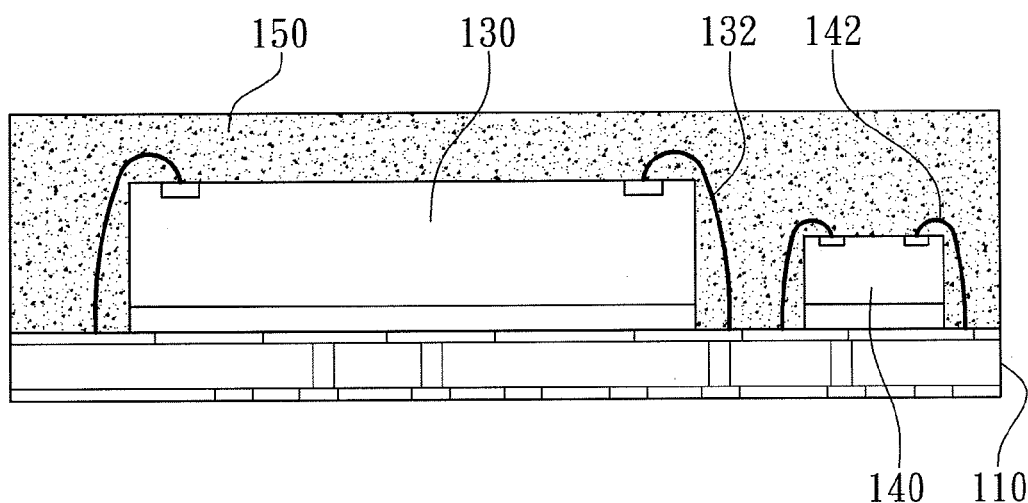
FIG. 1 is a cross-sectional view of a conventional MCP device.
Figure 2:
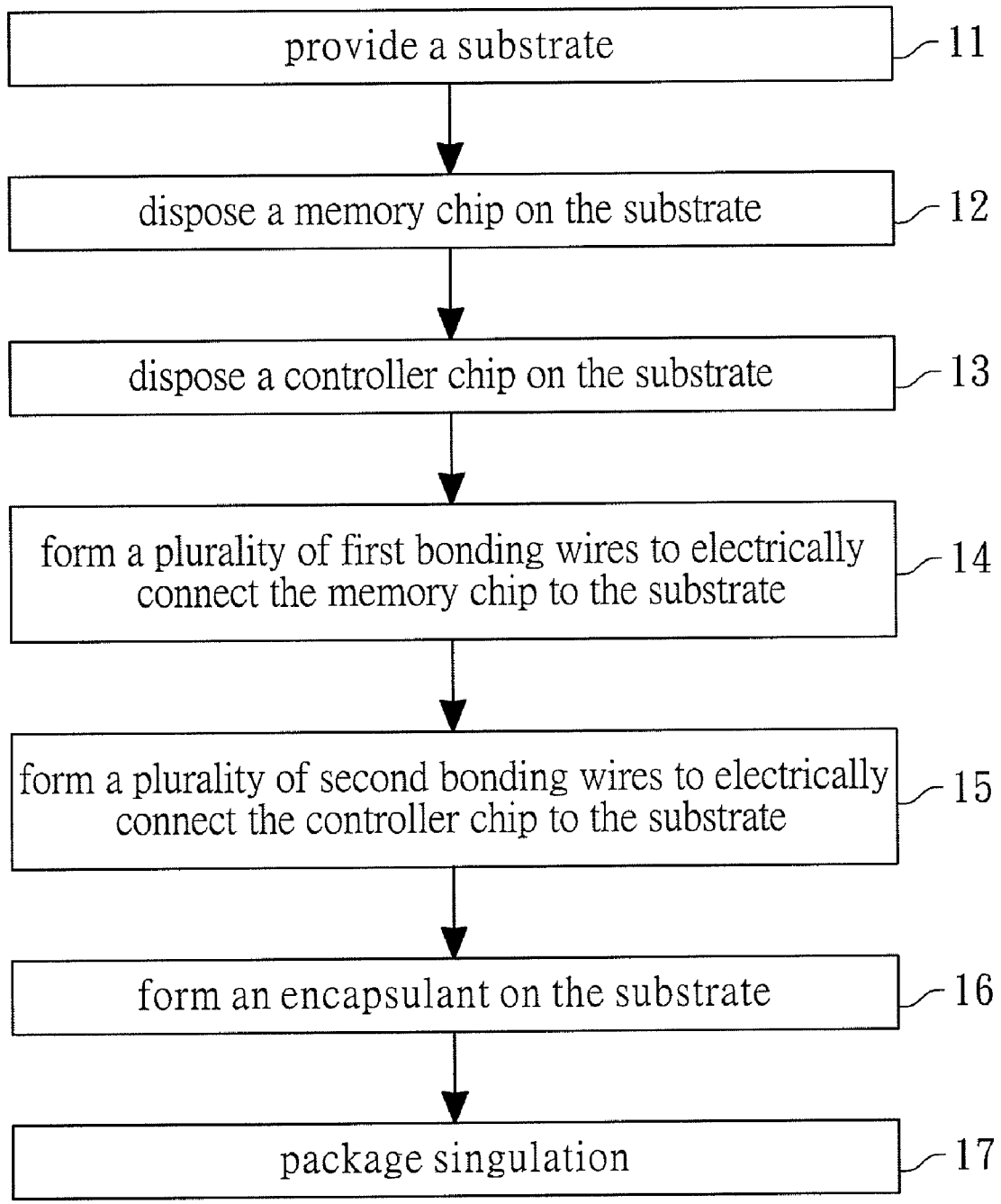
FIG. 2 is a block diagram of a process flow for fabricating conventional MCP device.
Figure 3:
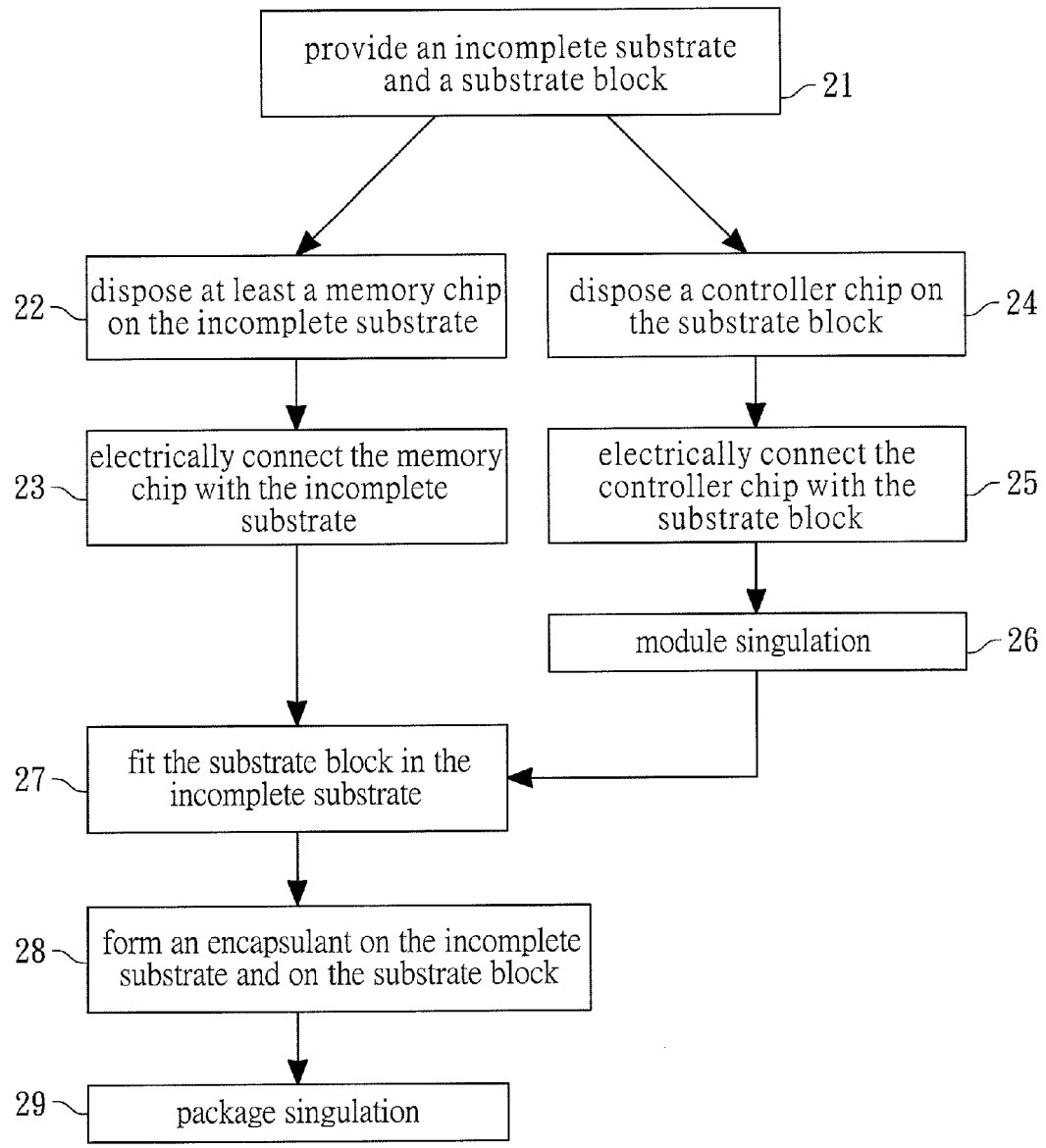
FIG. 3 is a major block diagram of the process flow for fabricating a MCP device having spliced substrates according to the preferred embodiment of the present invention.
Figure 4A:
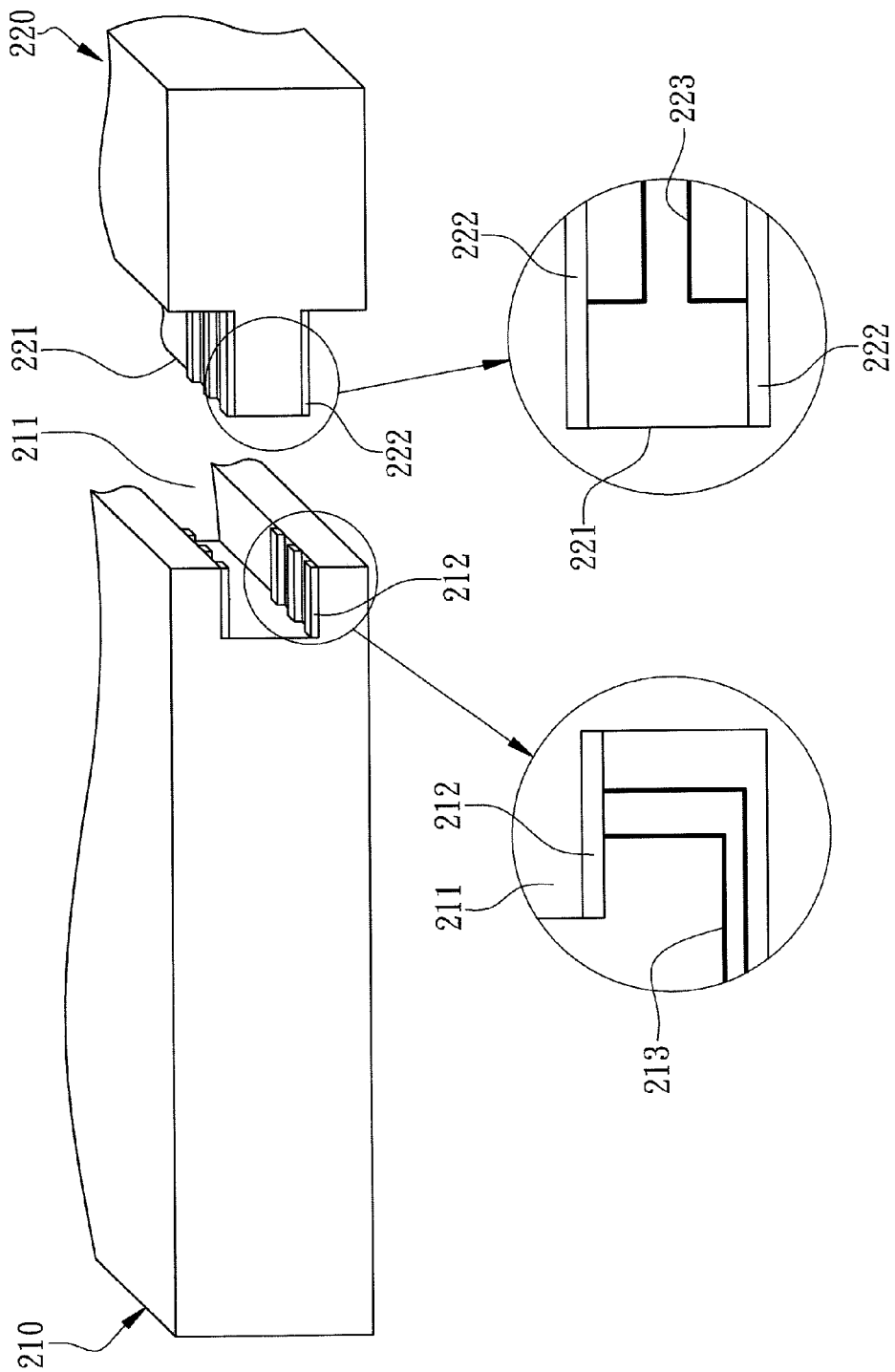
FIGS. 4A to 4I are component views in each processing step of the fabrication process flow of FIG. 3 according to the preferred embodiment of the present invention.
Figure 4B:
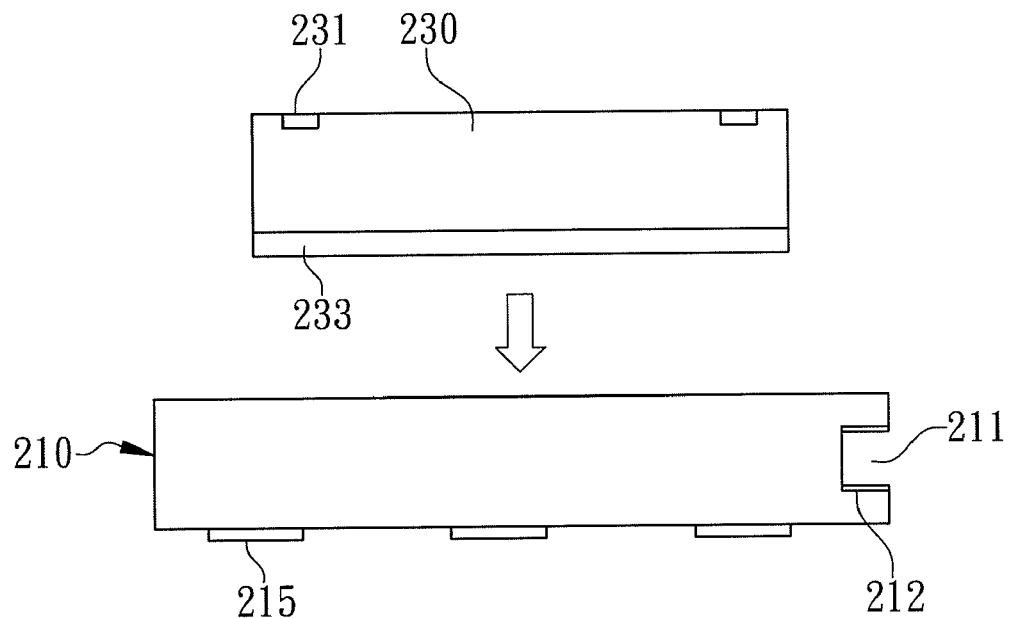
Figure 4C:
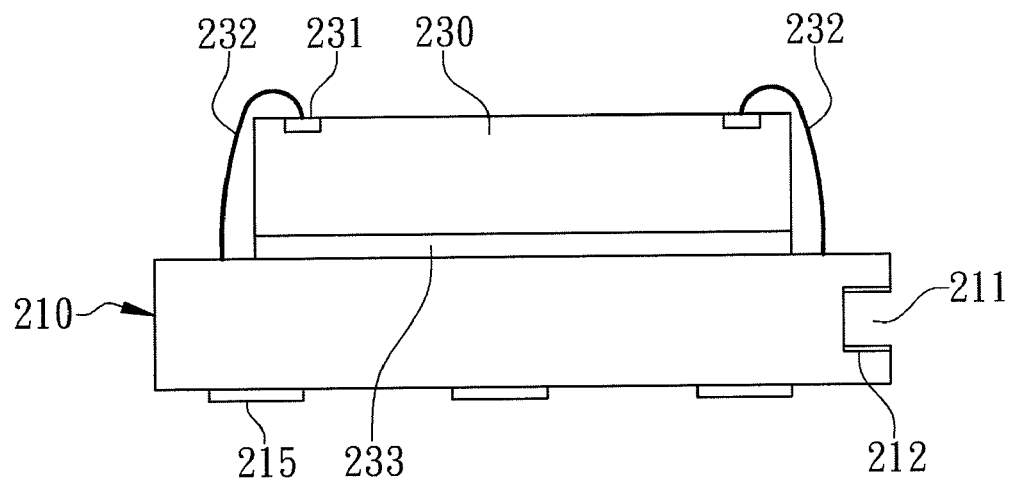
Figure 4D:
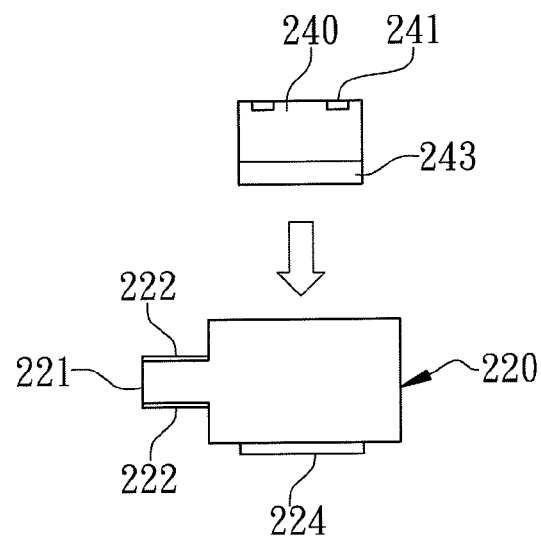
Figure 4E:
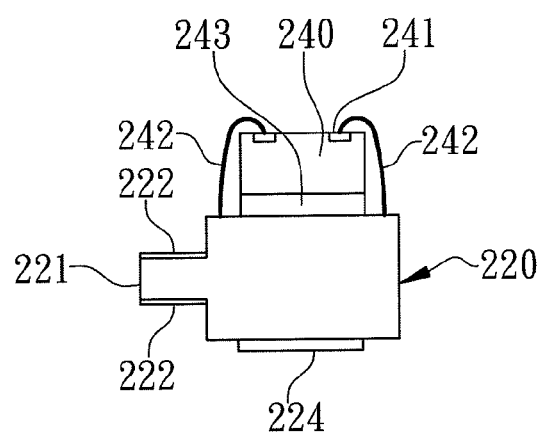
Figure 4F:
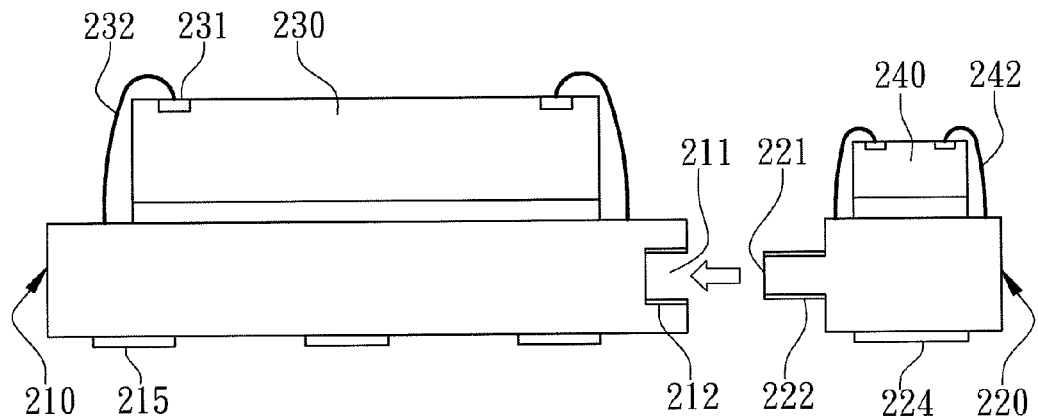
Figure 4G:
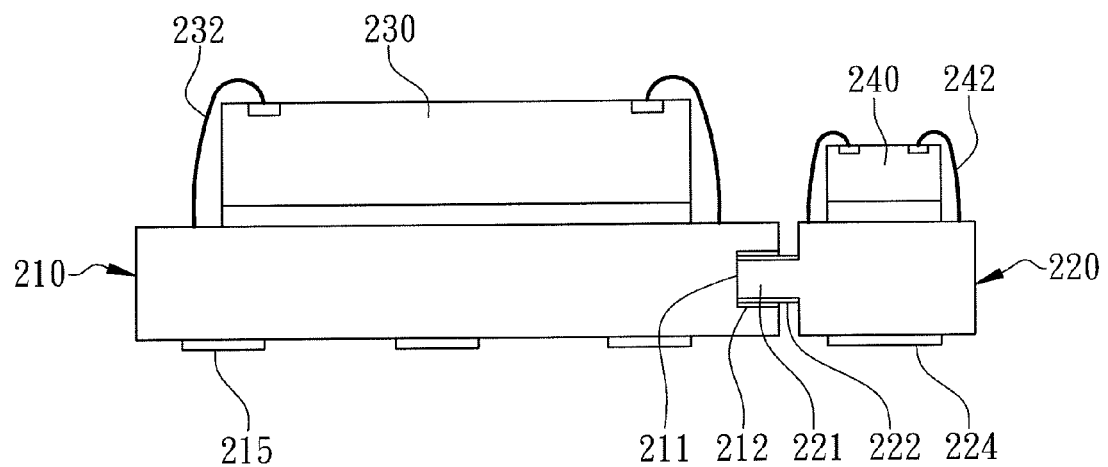
Figure 4H:
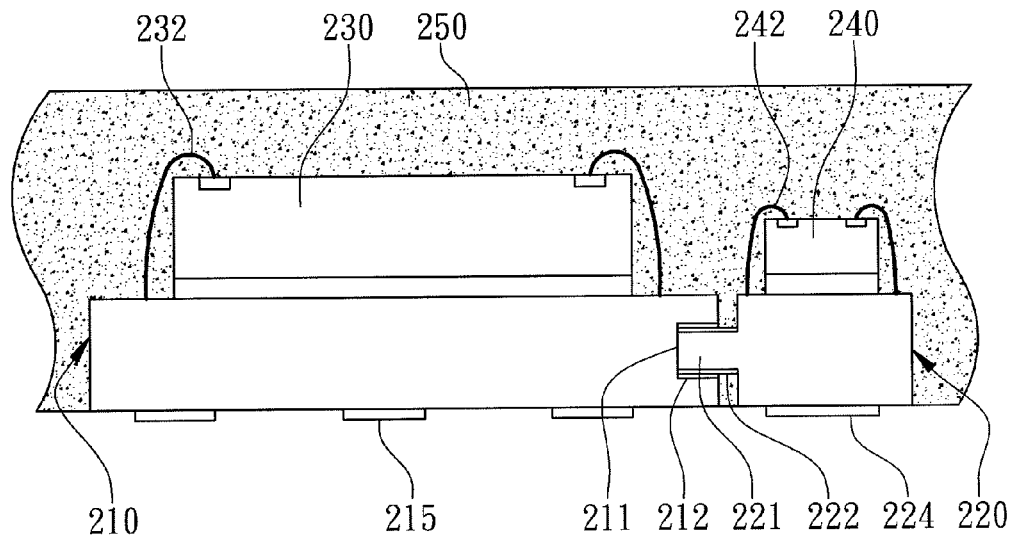
Figure 4I:
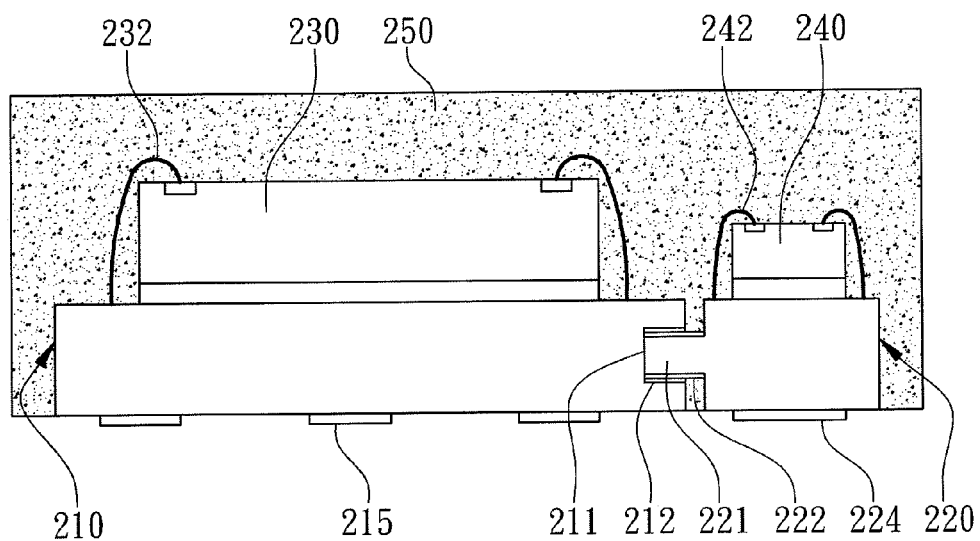
Figure 5:
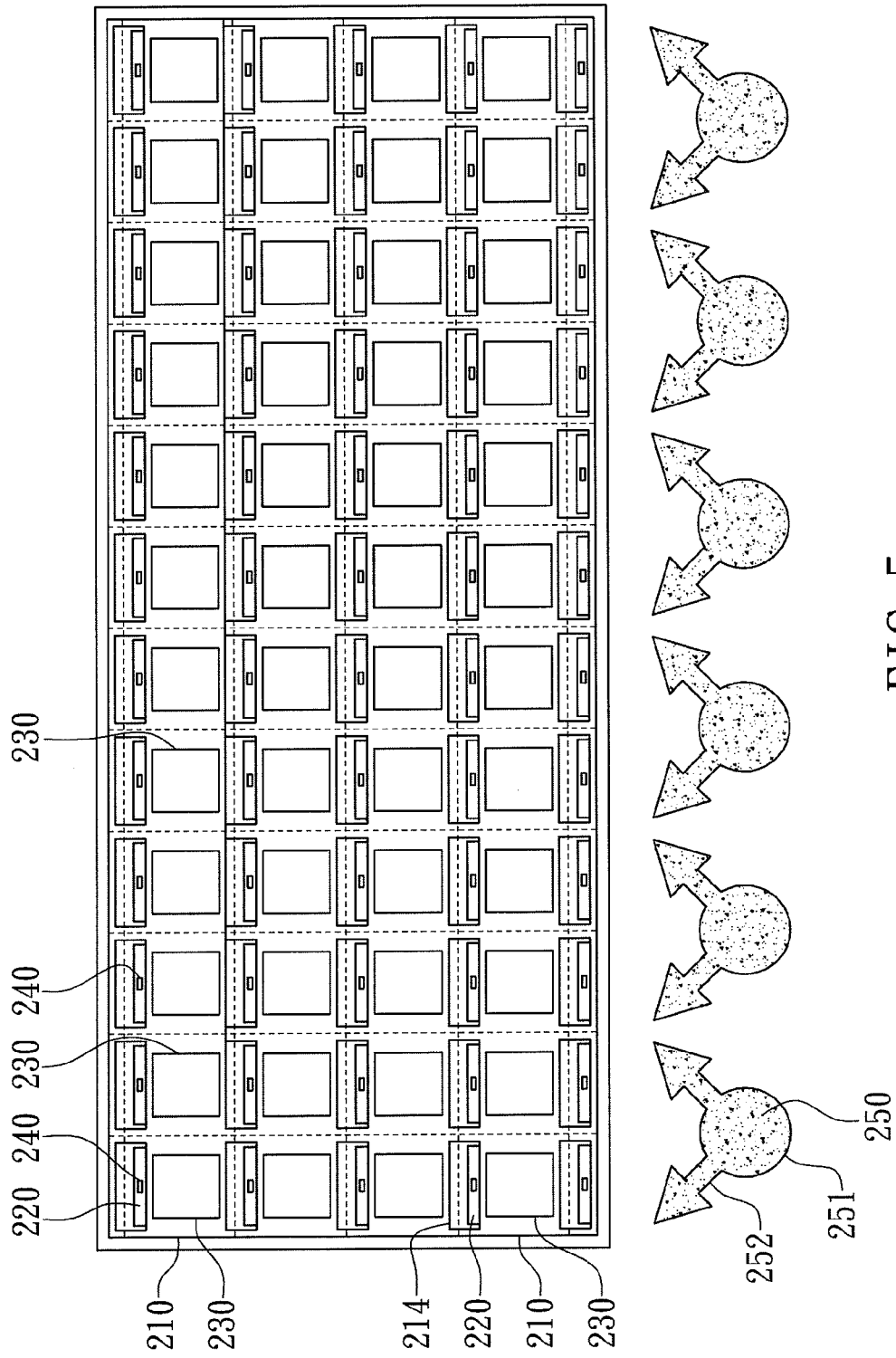
FIG. 5 is a top view of a substrate assembly formed by combining a plurality of the spliced incomplete substrates with a plurality of the substrate blocks before encapsulation according to the preferred embodiment of the present invention.

According to the preferred embodiment of the present invention, the fabrication process of a multi-chip package is revealed in FIG. 3 for a major block diagram of a processing flow, in FIGS. 4A to 4I for component views in each processing step, and in FIG. 5 for a top view of the substrate assembly formed by combining a plurality of the spliced incomplete substrates with a plurality of the substrate blocks before encapsulation where FIG. 4I is the cross-sectional view of the MCP device fabricated by the fabrication process flow of FIG. 3 according to the present invention. eMMC (embedded Multi Media Card) is used to illustrated in the present embodiment which can directly be mounted to a printed circuit board of a smart phone, a tablet computer, or a subnotebook/netbook computer. Each processing step is described in detail as follows.

As shown in FIG. 3 and FIG. 4A, in step 21, an incomplete substrate 210 and a substrate block 220 are provided. One sidewall of the incomplete substrate 210 has a first spliced portion 211 and one sidewall of the substrate block 220 has a second spliced portion 221 where the dimension of the incomplete substrate 210 is larger than the one of the substrate block 220. The incomplete substrate 210 means a substrate lacking of some portion with circuitry connecting to one of the chips in the MCP package. In this embodiment, the incomplete substrate 210 doesn't have the circuitry connecting to a controller chip. In step 21, the incomplete substrate 210 and the substrate block 220 can be individually formed in different substrate strips or different substrate panels. Normally, the incomplete substrate 210 and the substrate block 220 are small printed circuit boards with multi-layer circuitry, and the dimension of the incomplete substrate 210 is larger than the one of the substrate block 220. Additionally, the first spliced portion 211 and the second spliced portion 221 are designed to be male-female connection which can be interconnected such as if the first spliced portion 211 is a slot or opening then the second spliced portion 221 is a corresponding extruded plug. Preferably, the first spliced portion 211 can be a female slot with a plurality of first contacting fingers 212 disposed on two opposing sides in the female slot and the second spliced portion 221 is the corresponding male plug with a plurality of second contacting fingers 222 disposed on the top and bottom surfaces of the male plug where the first contacting fingers 212 are electrically connected to the internal circuitry of the incomplete substrate 210 through a plurality of first traces 213, and the second contacting fingers 222 are electrically connected to the internal circuitry of the substrate block 220 through a plurality of second traces 223. During the connection of the incomplete substrate 210 and the substrate block 220, even if the first spliced portion 211 and the second spliced portion 221 are loosened or tilted, at least one side of the first contacting fingers 212 still can be electrically connected with the corresponding second contacting fingers 222 to make good signal transmission between the incomplete substrate 210 and the substrate block 220.

As shown in FIG. 3 and FIG. 4B, in step 22, at least a memory chip 230 is disposed on the incomplete substrate 210. In the present embodiment, the memory chip 230 is a flash memory such as NAND flash memory which is formed by thinning and dicing a memory wafer where the number of memory chips 230 disposed on the incomplete substrate 210 is not limited which can be one or plural. A plurality of bonding pads 231 are disposed on the active surface of the memory chip 230. Furthermore, step 23 of electrically connecting the memory chip 230 with the incomplete substrate 210 may not be executed during the fabrication process flow of the MCP device, which depends on the die-attaching mechanism between the memory chip 230 and the incomplete substrate 210. when the die-attaching mechanism is flip-chip bonding, in step 22 the memory chip 230 is electrically connected to the incomplete substrate 210 through the bumps disposed on the memory chip 230 (not shown in figures). In this embodiment, the back surface of the memory chip 230 is adhered to the top surface of the incomplete substrate 210 by a die-attaching layer 233 where the die attaching 233 may be pre-formed on the back surface of the memory chip 230 and then attached to the incomplete substrate 210. Since the die-attaching mechanism in the present embodiment is the conventional die attaching process, therefore, step 23 needs to be executed. Moreover, a plurality of external contacting pads 215 are disposed on the bottom surface of the incomplete substrate 210. As shown in FIG. 3 and FIG. 4C, in step 23, the memory chip 230 is electrically connected to the incomplete substrate 210 by a plurality of first bonding wires 232 formed by wire bonding processes with both ends of the first bonding wires 232 bonded to the bonding pads 231 of the memory chip 230 and to the bonding fingers (not shown in the figure) of the incomplete substrate 210, respectively. As shown in FIG. 3, the heating operations during step 22 and step 23 do not affect the substrate block 220.

As shown in FIG. 3 and FIG. 4D, in step 24 a controller chip 240 is disposed on the substrate block 220. In this embodiment, the back surface of the controller chip 240 is attached to the top surface of the substrate block 220 by a die-attaching layer 243. The controller chip 240 is configured to control read/write operation of the memory chip 230 which is formed by thinning and dicing of a controller wafer where a plurality of bonding pads 241 are disposed on the active surface of the controller chip 240. Furthermore, a plurality of external contacting pads 224 are disposed on the bottom surface of the substrate block 220. If needed, as shown in FIG. 3 and FIG. 4E, step 25 may be executed to electrically connecting the controller chip 240 with the substrate block 220. The controller chip 240 is electrically connected to the substrate block 240 by a plurality of second bonding wires 242 formed by wire bonding processes with both ends of the second bonding wires 242 bonded to the bonding pads 241 of the controller chip 240 and to the bonding fingers of the substrate block 220 (not shown in the figures). As shown in FIG. 3, the heating operation during step 24 and step 25 do not affect the incomplete substrate 210. In the present embodiment, step 26 is executed to separate the substrate block 220 from a substrate strip with the attached controller chip 240 on the substrate block 220. The singulated substrate block 220 is a modular unit for fitting in the incomplete substrate 210. A glob top (not shown in the figures) such as liquid epoxy may be applied over the controller chip 240 before step 26 of module singulation.

As shown in FIG. 3, FIG. 4F and FIG. 4G, step 27 is executed to splice the incomplete substrate 210 and the substrate block 220 after step 22 of the disposition of the memory chip 230 on the incomplete substrate 210 and after step 24 of the disposition of the controller chip 240 on the substrate block 220. In step 27, the substrate block 220 is fitted in the incomplete substrate 210 as a complete modularized substrate by connecting the second spliced portion 221 with the first spliced portion 211. In a preferred embodiment, the incomplete substrate 210 and the substrate block 220 is horizontally connected to each other, i.e., horizontally spliced, similar to picture puzzle and the incomplete substrate 210 and the substrate block 220 are of a same thickness so that the spliced assembly of the incomplete substrate 210 and the substrate block 220 does not increased the package thickness.

As shown in FIG. 3 and FIG. 4H, in step 28, an encapsulant 250 is formed on the incomplete substrate 210 where the encapsulant 250 is further continuously formed on the substrate block 220 to be the package body of the MCP device. The encapsulant 250 can be an epoxy molding compound formed by transfer molding to encapsulate the memory chip 230 and the controller chip 240 together and to make the incomplete substrate 210, the substrate block 220, the memory chip 230, and the controller 240 as one assembly where the encapsulant 250 further encapsulates the first bonding wires 232 and the second bonding wires 242. Preferably, the opposing sidewall of the incomplete substrate 210 corresponding to the sidewall having the first spliced portion 211 and the opposing sidewall of the substrate block 220 corresponding to the sidewall having the second spliced portion 221 are encapsulated by the encapsulant 250 with the external contacting pads 215 and 224 exposed to prevent the substrate block 220 from peeling off. As shown in FIG. 5, since the encapsulant 250 is formed by transfer molding processes, the precursor of the encapsulant 250, i.e., uncured encapsulating material, is formed on a substrate strip including a plurality of the incomplete substrates 210 in which a plurality of the substrate blocks 220 are fitted through plunger channel 251 and runner 252 of the mold chest system to encapsulate the memory chips 230 and the controller chips 240 on the substrate strip. Moreover, the afore substrate strip having a plurality of incomplete substrates 210 further has a plurality of accommodating openings 214 disposed between the adjacent incomplete substrates 210 where the substrate blocks 220 can be jointed to and accommodated inside the openings 214.

Finally, as shown in FIG. 3, in step 29 of package singulation, the incomplete substrates 210 and the encapsulant 250 are cut along the scribe lines pre-defined on the substrate strip including the incomplete substrate 210 to obtain individual MCP devices as shown in FIG. 4I. In the present embodiment, the encapsulant 250 can has an appearance of an embedded multi-media card (eMMC) after step 29.

Therefore, the fabrication process of the MCP device according to the present invention implements different dimensions of the incomplete substrate 210 and the substrate block 220 as chip carriers for chips with different functions such as memory chips 230 and controller chips 240 along with a specific spliced method to connect the first spliced portion 211 and the second spliced portion 221 to make a spliced substrate assembly and then encapsulate the spliced substrate assembly during packaging processes where the processes, materials, and processing parameters according to specific functions of each individual chip can easily be optimized and integrated respectively in the same package to reduce substrate warpage during packaging processes. Moreover, by the connection between the first spliced portion 211 of the incomplete substrate 210 and the second spliced portion 221 of the substrate block 220 and by the formation of encapsulant 250 on both substrates, the package thickness does not increase due to the implementation of the spliced substrates and the separation between the incomplete substrate 210 and the substrate block 220 after assembly can be avoided.

Figure 6:
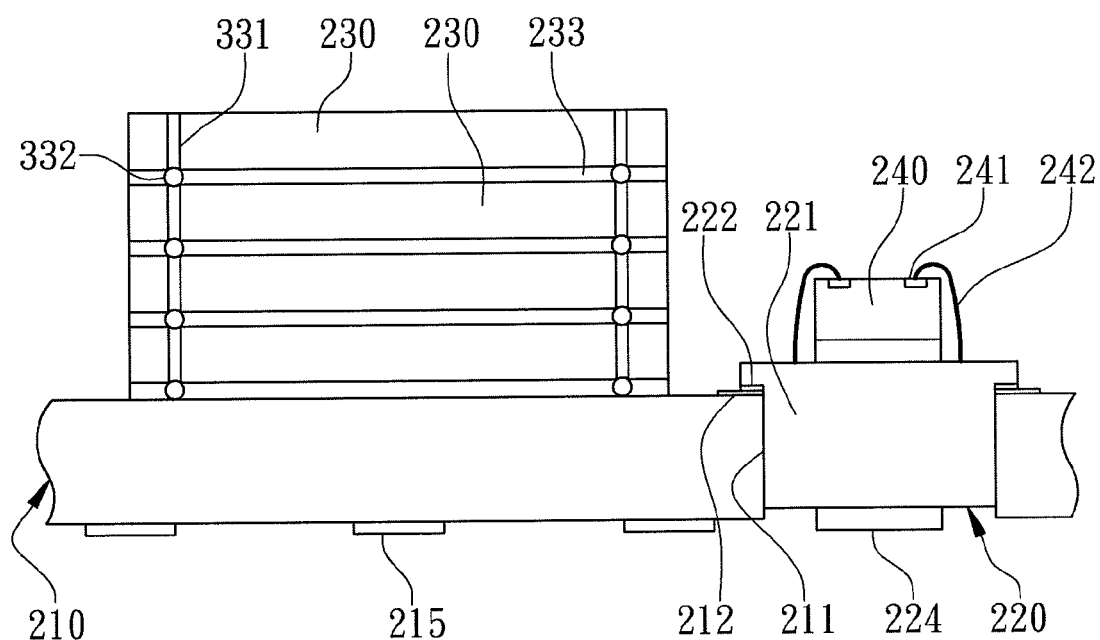
FIG. 6 is a cross-sectional view of another MCP device before encapsulation according to a various embodiment of the present invention.

The number of chips disposed and the method of electrical connection are not limited in the present invention where there are various spliced methods. As shown in FIG. 6, a plurality of memory chips 230 are stacked and disposed on the incomplete substrate 210 where the adjacent memory chips 230 are adhered by a die-attaching layer 233. A plurality of TSVs (through silicon vias) 331 are disposed in the memory chips 230 for vertically electrical connection where the TSVs 331 are electrically connected to each other by the bumps 332 disposed between the adjacent memory chips 230. Finally, the memory chips 230 are electrically connected to the incomplete substrate 210 where the memory chips 230 go through backside lapping processes in wafer forms to increase numbers of stacked chips in a limited package thickness. In a various embodiment, the first spliced portion 211 of the incomplete substrate 210 can be an opening where the first contacting pads 212 are located at the peripheries of the opening on the top surface of the incomplete substrate 210 and the second spliced portion 221 of the substrate block 220 is a blocking plug having an annular indentation where a plurality of second contacting pads 222 are disposed in the annular indentation so that the second spliced portion 221 can be vertically inserted into and splice with the opening-like first spliced portion 211 from top to bottom to make electrical connection between the first contacting pads 212 and the second contacting pads 222. Therefore, the incomplete substrate 210 carried with different numbers of memory chips 230 can easily splice with the substrate block 220 carried with different controller chips 240, and vice versa, to diversify product family. Moreover, the processes, materials, and processing parameters according to specific functions of each individual chip can easily be optimized and integrated in the same package.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A fabrication process of a multi-chip package comprising the steps of:
providing an incomplete substrate and a substrate block, wherein one sidewall of the incomplete substrate has a first spliced portion and one sidewall of the substrate block has a second spliced portion, and the dimension of the incomplete substrate is larger than the one of the substrate block;
disposing at least a memory chip on the incomplete substrate;
disposing a controller chip on the substrate block;
fitting the substrate block in the incomplete substrate as a complete substrate by connecting the second spliced portion of the substrate block with the first spliced portion of the incomplete substrate after the disposition of the memory chip on the incomplete substrate and after the disposition of the controller chip on the substrate block; and forming an encapsulant on the incomplete substrate, wherein the encapsulant is further formed on the substrate block to encapsulate the memory chip and the controller chip together.

2. The fabrication process as claimed in claim 1, wherein the incomplete substrate and the substrate block are spliced in horizontal arrangement.

3. The fabrication process as claimed in claim 1, wherein the encapsulant is an epoxy molding compound formed by transfer molding.

4. The fabrication process as claimed in claim 3, wherein the incomplete substrate is formed in a substrate strip, and the substrate strip has an accommodating opening for accommodating the substrate block.

5. The fabrication process as claimed in claim 4, wherein the substrate block is formed in another substrate strip, the fabrication process further comprising a module singulation step including separating the substrate block from a substrate strip with the attached controller chip on the substrate block.

6. The fabrication process as claimed in claim 5, further comprising a package singulation step including cutting through the encapsulant so that the encapsulant has an appearance of an embedded multi-media card.

7. The fabrication process as claimed in claim 1, wherein the first spliced portion is a female slot having a plurality of first contacting fingers disposed on two opposing sides in the female slot, and the second spliced portion is a corresponding male plug having a plurality of second contacting fingers disposed on a top surface and a bottom surface of the male plug.

8. The fabrication process as claimed in claim 1, wherein the incomplete substrate and the substrate block are of a same thickness.

9. A multi-chip package comprising:

an incomplete substrate and a substrate block, wherein one sidewall of the incomplete substrate has a first spliced portion and one sidewall of the substrate block has a second spliced portion, and the dimension of the incomplete substrate is larger than the one of the substrate block;

at least a memory chip disposed on the incomplete substrate;

a controller chip disposed on the substrate block, wherein the substrate block is fitted in the incomplete substrate by connecting the second spliced portion with the first spliced portion; and an encapsulant formed on the incomplete substrate, wherein the encapsulant is further formed on the substrate block to encapsulate the memory chip and the controller chip together.

10. The multi-chip package as claimed in claim 9, wherein the incomplete substrate and the substrate block are spliced in horizontal arrangement.

11. The multi-chip package as claimed in claim 9, wherein the encapsulant is an epoxy molding compound.

12. The multi-chip package as claimed in claim 11, wherein the encapsulant has an appearance of an embedded multi-media card.

13. The multi-chip package as claimed in claim 9, wherein the first spliced portion is a female slot having a plurality of first contacting fingers disposed on two opposing sides in the female slot, and the second spliced portion is a corresponding male plug having a plurality of second contacting fingers disposed on a top surface and a bottom surface of the male plug.

14. The multi-chip package as claimed in claim 9, wherein the incomplete substrate and the substrate block are of a same thickness.

15. The multi-chip package as claimed in claim 9, wherein an opposing sidewall of the incomplete substrate corresponding to the sidewall having the first spliced portion and an opposing sidewall of the substrate block corresponding to the sidewall having the second spliced portion are encapsulated by the encapsulant.

* * * * *